(12) United States Patent
Chen et al.

(10) Patent No.: US 12,692,626 B2
(45) Date of Patent: Jul. 28, 2026

(54) APPARATUS FOR PRODUCING INGOT

(71) Applicant: Industrial Technology Research Institute, Hsinchu (TW)

(72) Inventors: Yun-Feng Chen, Changhua County (TW); Ping-Kuan Chang, Tainan City (TW); Shui-Chin Liu, Tainan City (TW); Ming-Tsun Kuo, Hsinchu County (TW); Sung-Yu Chen, Taichung City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 303 days.

(21) Appl. No.: 18/142,790

(22) Filed: May 3, 2023

(65) Prior Publication Data

US 2024/0191397 A1 Jun. 13, 2024

(30) Foreign Application Priority Data

Dec. 7, 2022 (TW) .................................. 111146941

(51) Int. Cl.
*C30B 35/00* (2006.01)

(52) U.S. Cl.
CPC .......... *C30B 35/007* (2013.01); *C30B 35/002* (2013.01)

(58) Field of Classification Search
CPC ...... C30B 23/00; C30B 35/002; C30B 35/007
See application file for complete search history.

(56) References Cited

U.S. PATENT DOCUMENTS

| | | | |
|---|---|---|---|
| 5,368,282 A | 11/1994 | Mortimer | |
| 5,968,261 A | 10/1999 | Barrett | |
| 2002/0004017 A1 | 1/2002 | Quayle | |
| 2012/0103249 A1 | 5/2012 | Gupta | |
| 2013/0174784 A1* | 7/2013 | Kondo | C30B 25/12 |
| | | | 118/726 |
| 2021/0230768 A2* | 7/2021 | Fujikawa | C30B 23/06 |

FOREIGN PATENT DOCUMENTS

| | | |
|---|---|---|
| CN | 203546203 U | 4/2014 |
| CN | 104233458 A | 12/2014 |

(Continued)

OTHER PUBLICATIONS

English computer translation of CN-212375418-U (Year: 2025).*

(Continued)

*Primary Examiner* — Matthew J Song
(74) *Attorney, Agent, or Firm* — WPAT, PC

(57) ABSTRACT

An apparatus for producing an ingot includes a crucible and a lid. The crucible, as a cylindrical container for accommodating a raw crystal-growing material, has an annular top edge further having an annular non-90° first guiding part. The lid provides a bottom for disposing a seed, and the bottom is furnished thereon a bottom protrusion. An outer wall of the bottom protrusion is furnished with an annular non-90° second guiding part corresponding to the first guiding part. The lid is detachable to cover the crucible by having the bottom protrusion to fit the annular the main inner wall, the first guiding part and the annular second guiding part to contact each other, and a portion of the bottom of the lid surrounding the bottom protrusion to contact the top edge of the crucible.

12 Claims, 11 Drawing Sheets

(56)  References Cited

FOREIGN PATENT DOCUMENTS

| | | | | | |
|---|---|---|---|---|---|
| CN | 205603725 U | | 9/2016 | | |
| CN | 106232877 A | | 12/2016 | | |
| CN | 211782719 U | * | 10/2020 | .............. | F27B 14/12 |
| CN | 111424319 B | | 12/2020 | | |
| CN | 212375418 U | * | 1/2021 | ............ | C30B 23/00 |
| CN | 216528737 U | | 5/2022 | | |
| JP | 2013-193943 A | | 9/2013 | | |
| TW | 201209199 A | | 3/2012 | | |
| TW | 202022175 A | | 6/2020 | | |
| WO | WO2017113368 A1 | | 7/2017 | | |

OTHER PUBLICATIONS

English computer translation of CN-211782719-U (Year: 2025).*
Sanchez et al. "Formation of Thermal Decomposition Cavities in Physical Vapor Transport of Silicon Carbide", 1999, Journal of Electronic Materials.
Tairov. "Growth of bulk SiC", 1995, Materials Science and Engineering.
Wellmann et al. "SiC single crystal growth by a modified physical vapor transport technique", 2005, Journal of Crystal Growth.
Lee et al. "Effect of Porous Graphite for High Quality SiC Crystal Growth by PVT Method", 2015, Materials Science Forum.
Mitani et al. "Reduction of threading screw dislocations in 4H-SiC crystals by a hybrid method with solution growth and physical vapor transport growth", 2021, Journal of Crystal Growth.
TW OA issued on May 31, 2023.

* cited by examiner

APPARATUS FOR PRODUCING INGOT

CROSS REFERENCE TO RELATED APPLICATION

This application claims the benefits of Taiwan application Serial No. 111146941, filed on Dec. 7, 2022, the disclosures of which are incorporated by references herein in its entirety.

TECHNICAL FIELD

The present disclosure relates in general to an apparatus for producing an ingot.

BACKGROUND

In terms of crystal growth technology for semiconductor ingots, the conventional methods for growing silicon carbide (SiC) crystal ingots may include a physical vapor transport (PVT, also known as a sublimation method), a high-temperature chemical vapor deposition (HTCVD) or a solution growth method.

In particular, due to advantages of a fast crystal growth rate, simple operation and a low cost, the PVT is the most popular crystal growth method currently used in this industry.

In the art of the physical vapor transport method, a crucible device is the main device for growing silicon carbide (SiC) ingots. The crucible device is mainly consisted of a lid and a crucible. SiC powders are firstly placed into the bottom of the crucible, and a seed is set to a bottom of the lid for facing the SiC powders in the crucible. Then, the crucible device is placed into a chamber. After the chamber is evacuated and then heated, the crucible device may be heated to a preset temperature (for example, above 2,000° C.), the SiC powders are sublimated into various SiC molecules arise to be further attached or deposited onto the seed for forming a SiC crystal on a surface of the seed.

Nevertheless, when the PVT is used to grow crystals, a pressure difference across a wall of the crucible exists at an initial stage of vacuuming the chamber, from which the lid may be forced to float due to a depressurization of the process. After this pressure difference is eliminated, the lid would drop onto the crucible to closely contact a top surface of the crucible. Such a temporary pressure difference is one of factors that affect the quality and yield of crystal growth.

Accordingly, the issue how to develop an "apparatus for producing ingot" that provides a guide structure for matching tightly the lid and the crucible through ensuring the lid to fall down and tightly engage the crucible after the vacuuming process, is definitely urgent to the skill in the art.

SUMMARY

In one embodiment of this disclosure, an apparatus for producing ingot, applied to an ingot-growing process, includes:

a crucible, having a hollow cylindrical body with an end bottom to provide thereinside an internal space for accommodating a raw crystal-growing material, a top of the body having oppositely an annular main outer wall and an annular main inner wall, an outer diameter of the annular main outer wall being greater than an inner diameter of the annular main inner wall, an annular top edge being formed to connect the annular main outer wall and the annular main inner wall, a connection portion of the annular main inner wall and the annular top edge being defined as an annular first guiding part, the annular first guiding part being a non-right angle structure; and a lid, having a bottom for disposing a seed, the bottom having a bottom protrusion, a maximum outer diameter of the bottom protrusion being less than a maximum outer diameter of the lid, an outer wall of the bottom protrusion having an annular second guiding part corresponding to the annular first guiding part, the annular second guiding part being a non-right angle structure, the lid being detachable to cover the top of the crucible by having the bottom protrusion to be inserted into the annular main inner wall, the annular first guiding part and the annular second guiding part to contact with each other, and a portion of the bottom of the lid surrounding the bottom protrusion to contact with the top edge of the crucible.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
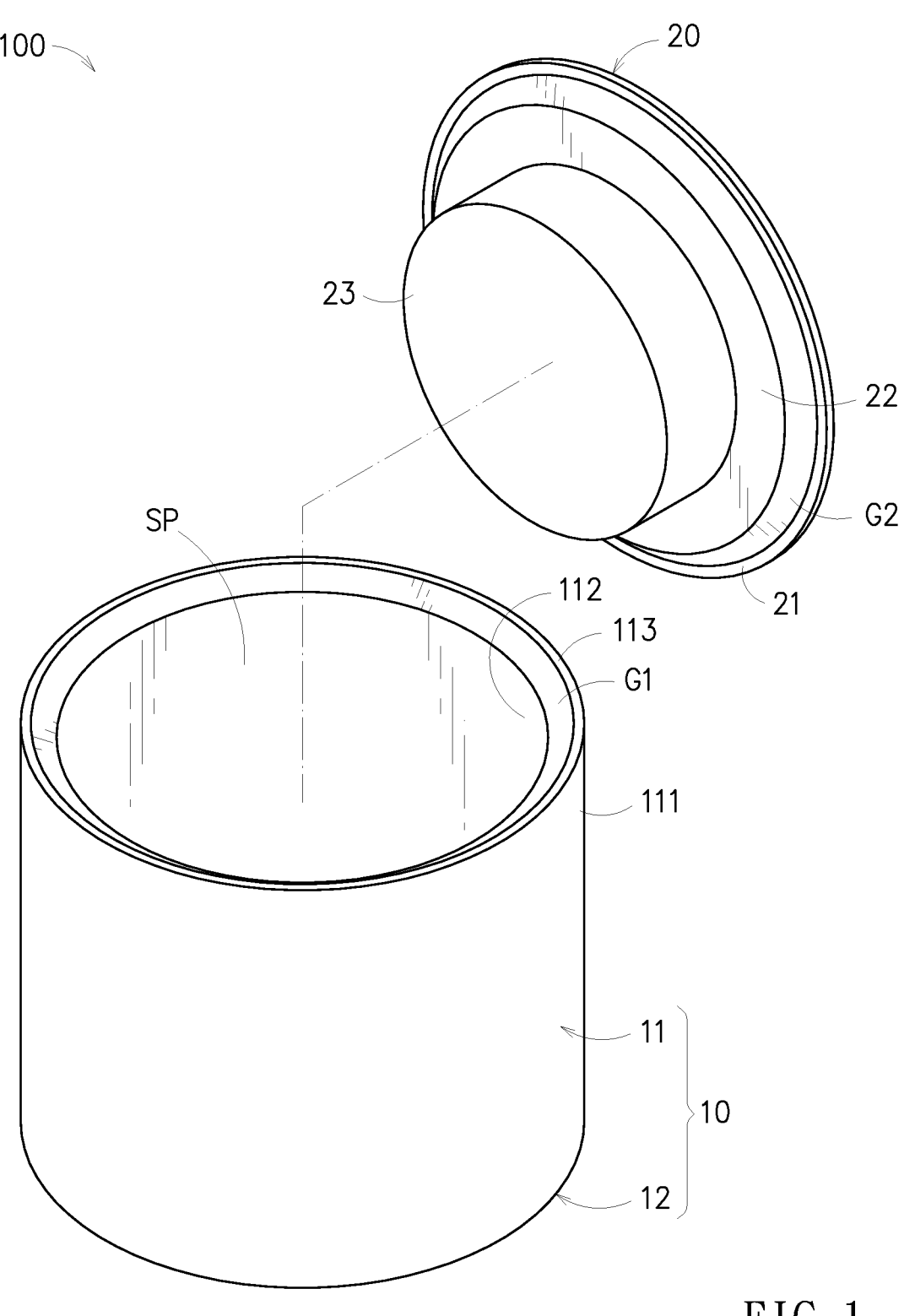
FIG. 1 is a schematic exploded view of an embodiment of the apparatus for producing an ingot in accordance with this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
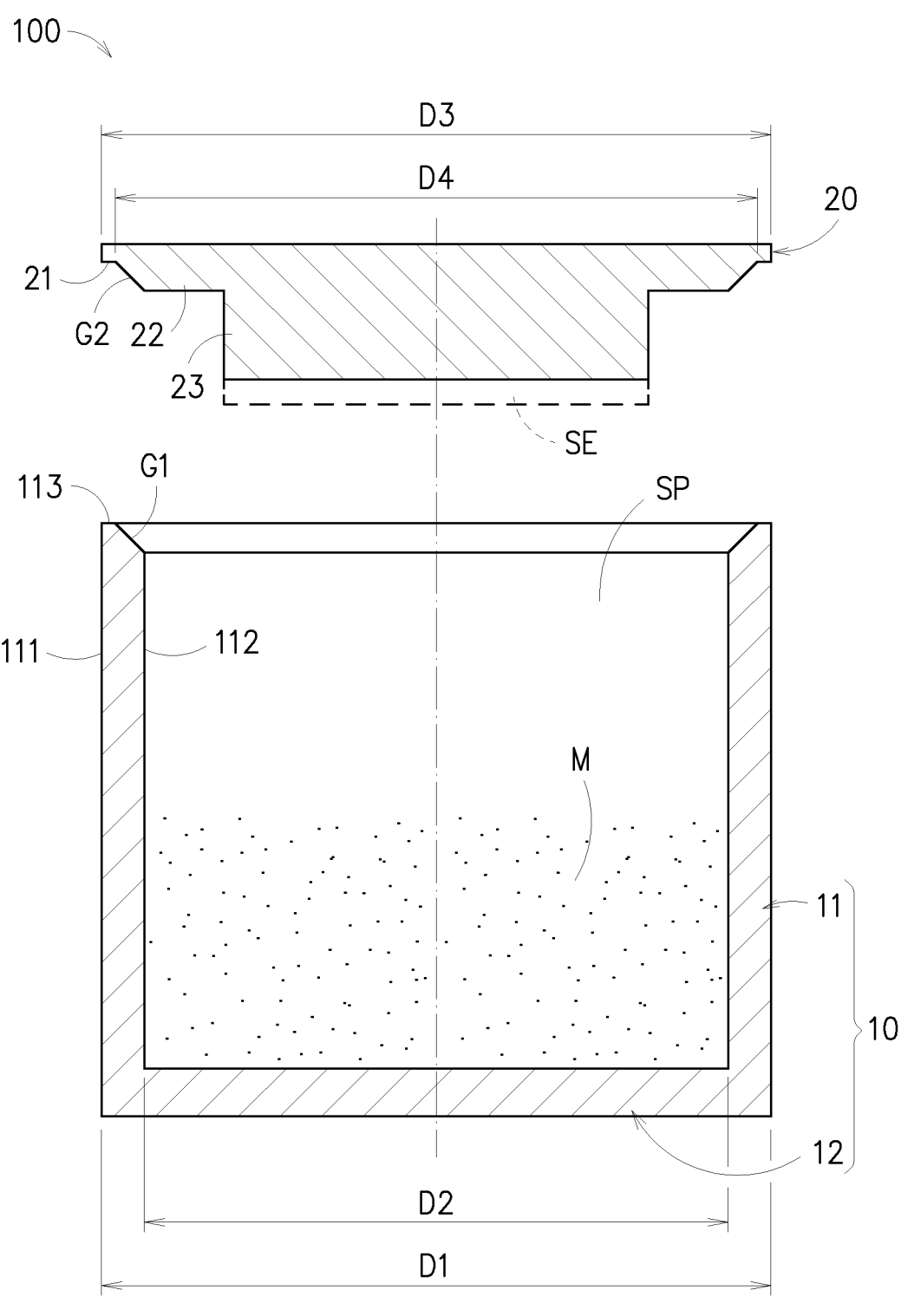
FIG. 2 in a schematic axial cross-sectional view of FIG. 1.
Figure 3:
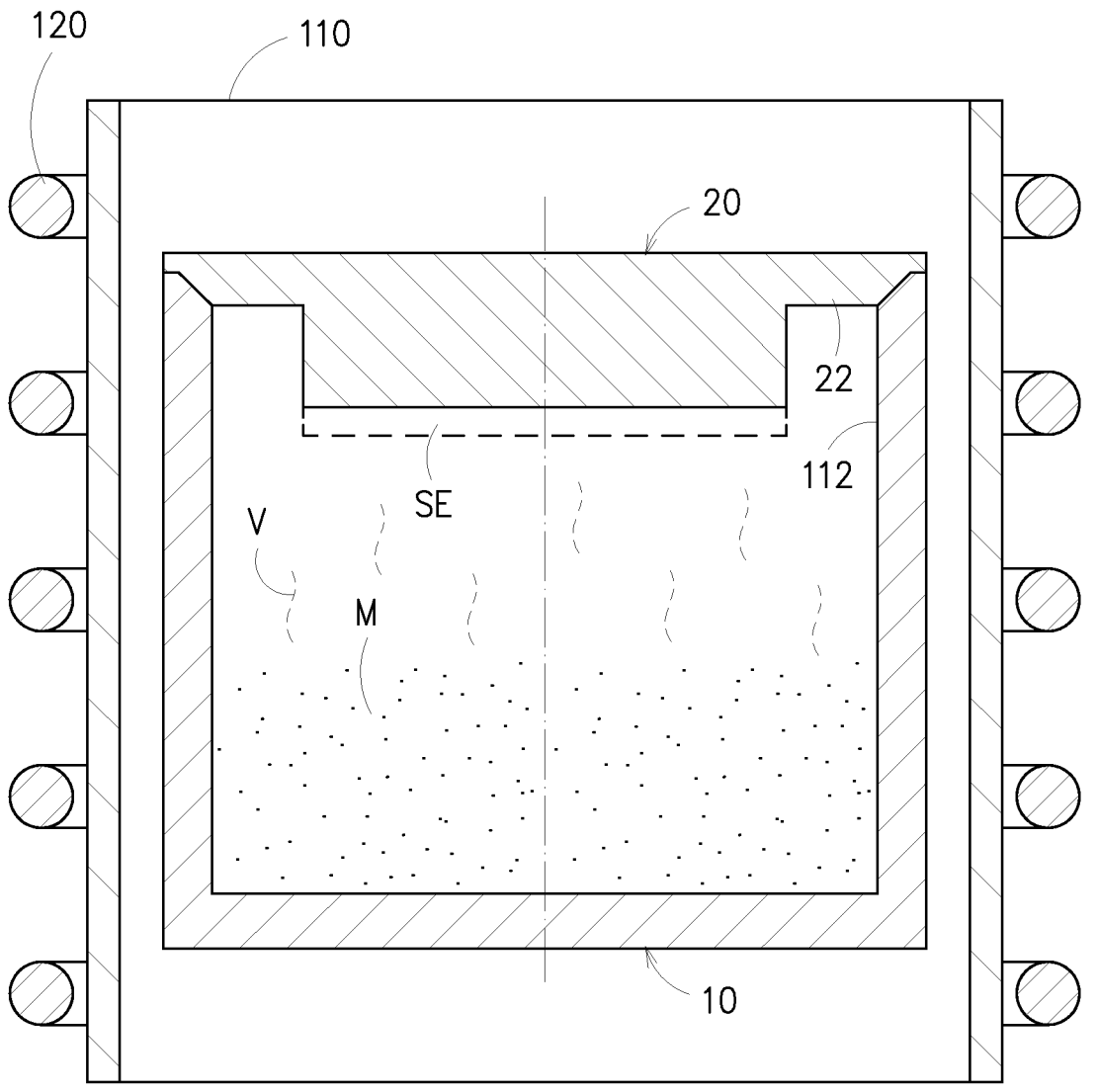
FIG. 3 is a schematic axial cross-sectional view of FIG. 1 in an assembled state in a chamber.

Referring to FIG. 1 to FIG. 3, in this embodiment, the apparatus for producing an ingot 100 includes a crucible 10 and a lid 20. The crucible 10 and the lid 20 can be made of graphite.

The crucible 10 has a hollow cylindrical body 11 with an end bottom 12. As shown in FIG. 2, the body 11 and the end bottom 12 are integrated to form an internal space SP for accommodating a raw crystal-growing material M.

It shall be explained that the crucible 10 may be variously shaped, and the embodiment shown in FIG. 1 through FIG. 3 demonstrates only one of those embodiments.

A top portion of the body 11 has a wall having oppositely an annular main outer wall 111 and an annular main inner wall 112. An outer diameter D1 of the main outer wall 111 is greater than an inner diameter D2 of the main inner wall 112.

An annular top edge 113 is formed to connect the main outer wall 111 and the main inner wall 112 at the top portion of the body 11. In particular, an annular first guiding part G1 is defined as the portion connecting the main inner wall 112 and the top edge 113. As shown in FIG. 1 to FIG. 3, the first guiding part G1 is a chamfer structure.

It shall be explained that the first guiding part G1 is no limited to the chamfer shown in FIG. 1 to FIG. 3. In this disclosure, the first guiding part G1 can be a convex arc, a concave arc or any non-right angle geometric shape.

Referring to FIG. 1 to FIG. 3, a bottom protrusion 22 is provided to a bottom 21 of the lid 20, the maximum outer diameter D4 of the bottom protrusion 22 is less than the maximum outer diameter D3 of the lid 20.

The bottom 21 of the lid 20 is provided to dispose a seed SE. In the embodiment shown in FIG. 1 to FIG. 3, a protrusive platform 23 is provided to a central portion of the bottom protrusion 22 of the lid 20, and the seed SE is disposed at the protrusive platform 23 by facing the crucible 10.

It shall be explained that the lid 20 of this disclosure can be variously shaped, as long as to provide a zone at the surface of the lid 20 that faces the crucible 10 (i.e., the bottom of the lid 20) for disposing the seed SE. Namely, the protrusive platform 23 shown in FIG. 1 to FIG. 3 is, but not limited thereto, simply one of various embodiments according to the disclosure.

Referring to FIG. 1 to FIG. 3, the outer wall of the bottom protrusion 22 has an annular second guiding part G2 corresponding to the first guiding part G1. In the embodiment shown in FIG. 1 to FIG. 3, the second guiding part G2 is formed as another chamfer.

It shall be explained that the structure of the second guiding part G2 is not limited to the chamfer shown in FIG. 1 to FIG. 3. In this disclosure, the second guiding part G2 can be a convex arc, a concave arc or any non-right angle geometric shape.

Referring to FIG. 2 and FIG. 3, the lid 20 is detachable to cover the top of the crucible 10 by having the bottom protrusion 22 to be inserted into the main inner wall 112, with the first guiding part G1 to contact the second guiding part G2, and a portion of the bottom 21 of the lid 20 that surrounds the bottom protrusion 22 to contact with the top edge 113 of the crucible 10.

In a typical crystal-growing process, the apparatus 100 for producing an ingot consisted of the lid 20 and the crucible 10 of FIG. 3 is firstly placed into a chamber 110, in which the chamber 110 can be made of quartz. Then, the chamber 110 is vacuumed, and further the heating device 120 disposed out of the chamber 110 is applied to heat up the apparatus 100 for producing an ingot. As the temperature inside the chamber 110 is risen to a predetermined temperature (for example, over 2,000° C.), the raw crystal-growing material M would be sublimated into sublimation molecules V to be transferred onto the seed SE for forming crystal deposited on the seed SE.

In the aforesaid vacuuming step upon the chamber 110, a floating situation would happen to the lid in a conventional design. However, with the pairing of the crucible 10 and the lid 20 and a self-alignment design consisted of the first guiding part G1 and the second guiding part G2 in accordance with this disclosure, the lid 20 can be correctly engaged with the top of the crucible 10 right after the floated lid 20 drops down to the crucible 10.

Figure 4:
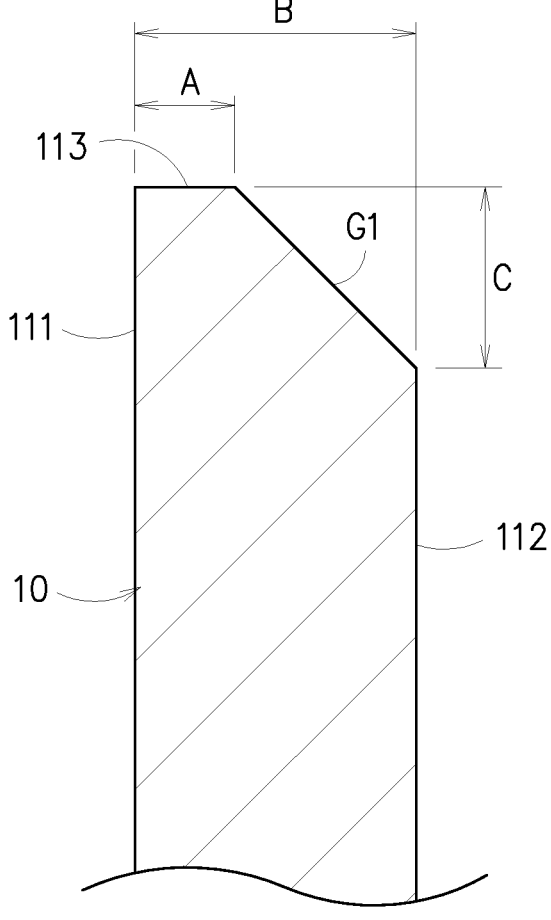
FIG. 4 is a schematic enlarged view of a top portion of the body of FIG. 1.

Referring to FIG. 4, a top portion of the body of the crucible 10 shown in FIG. 1 is schematically enlarged and illustrated a cross-sectional view. As shown, in defining the first guiding part G1, following dimensions shall be specified, in which a width of the top edge 113 is symbolized as an A, a distance between the main outer wall 111 and the main inner wall 112 is symbolized as a B, a vertical distance between the top edge 113 and a lower edge of the first guiding part G1 is symbolized as a C. In one embodiment, a relationship of A, B and C can be:

$$A < B,$$

$$0.5 \leq A < 100 \text{ mm},$$

$$3 \leq B \leq 100 \text{ mm, and}$$

$$1 \leq C \leq 600 \text{ mm}.$$

In one embodiment, C can be ranged by $1 \leq C \leq 250$ mm. In one embodiment, a relationship of A, B and C can be:

$$A < B,$$

$$0.5 \leq A < 50 \text{ mm},$$

$$3 \leq B \leq 50 \text{ mm, and}$$

$$1 \leq C \leq 125 \text{ mm}.$$

The dimensions of A, B and C are not particularly limited, according to practical requirements of the ingot. For example, A=4 mm, B=10 mm, C=6 mm; or, A=4 mm, B=10 mm, C=10 mm; or, A=25 mm, B=31 mm, C=32 mm; or, A=30 mm, B=40 mm, C=70 mm.

In this disclosure, the aforesaid dimensional relationships for the first guiding part G1 of FIG. 4 can be also applicable to the second guiding part G2 of the lid 20 shown in FIG. 1. However, dimensions of the first guiding part G1 and the second guiding part G2 can be identical or different.

Figure 5A:
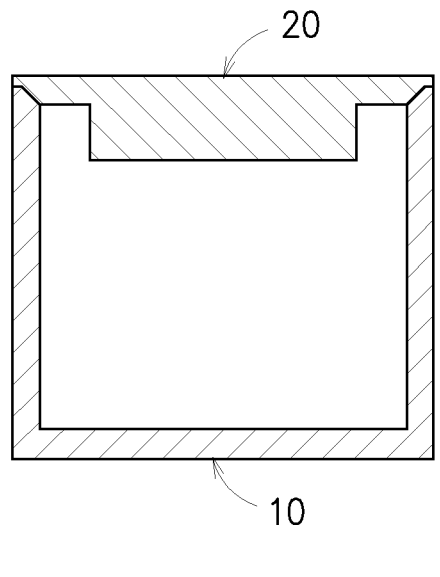
FIG. 5A to FIG. 5D demonstrate schematically different stages of the vacuuming process while in operating the apparatus for producing an ingot of FIG. 1.
Figure 5B:
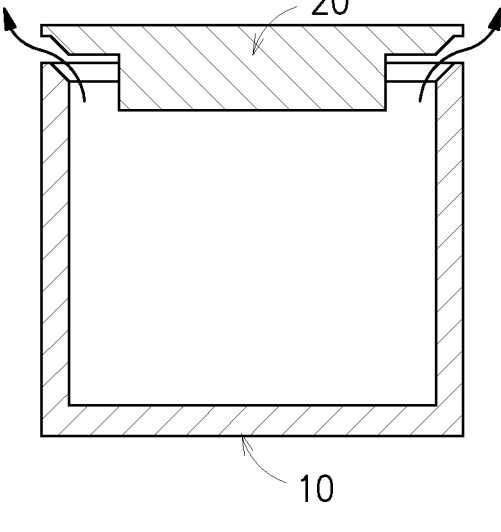
Figure 5C:
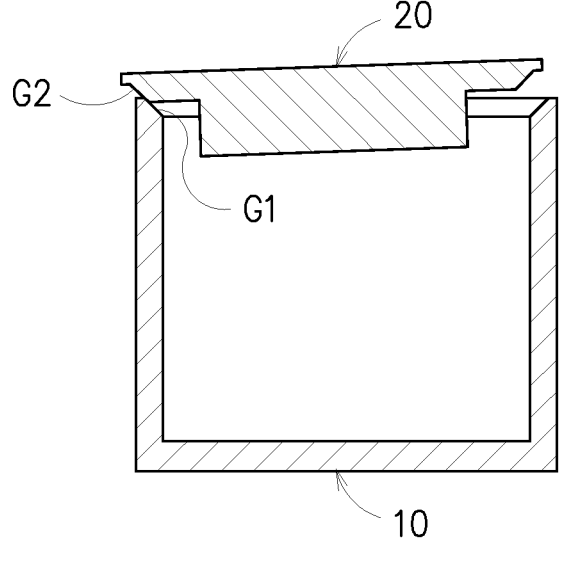
Figure 5D:
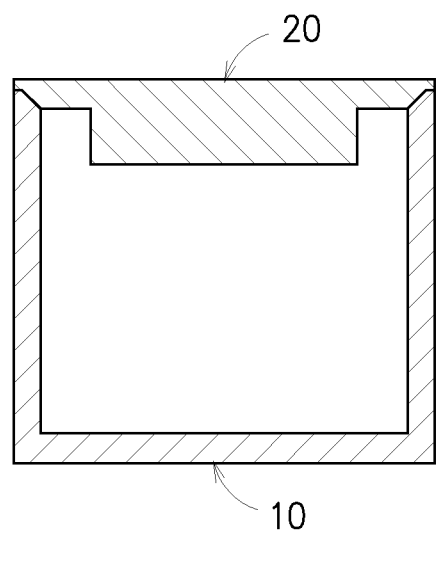

Referring to FIG. 5A to FIG. 5D, FIG. 5A demonstrates schematically a state prior to the vacuuming, where the lid 20 and the crucible 10 are tightly engaged; FIG. 5B demonstrates schematically a state in vacuuming, where the lid 20 is floated to disengage the crucible 10; FIG. 5C demonstrates schematically a state after the vacuuming, where the lid 20 drops to engage the crucible 10 by having the first guiding part G1 and the second guiding part G2 to match and align; and, FIG. 5D demonstrates schematically a state after the first guiding part G1 has matched correctly with the second guiding part G2, where the lid 20 and the crucible 10 are tightly engaged.

As described above, other than the chamfer structures shown in FIG. 1 to FIG. 3, the first guiding part G1 and the second guiding part G2 can be structured to be non-right angle structures. In the following description, the first guiding part G1 at the top of the crucible 10 is taken as an example for elucidating various aspects of the first guiding part G1 and the second guiding part G2 in accordance with this disclosure.

Figure 6A:
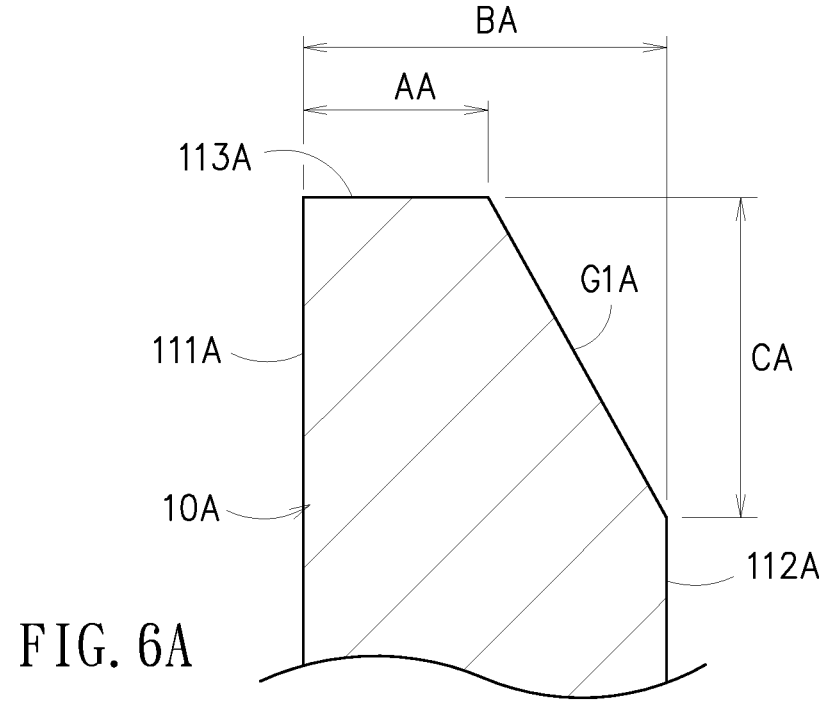
FIG. 6A to FIG. 6D show schematically different exemplary examples of the top portion of the body of FIG. 1.

Referring to FIG. 6A, a cross-sectional view of the top portion of the crucible 10A is schematically shown. FIG. 6A provides dimensions of the first guiding part G1A different to those thereof in FIG. 1. In comparison to the first guiding part G1 of FIG. 4, a slope of the first guiding part G1A of FIG. 6A is greater (i.e., A<AA) and longer (i.e., C<CC). As shown, a width of the top edge 113A is AA, a distance between the main outer wall 111A and the main inner wall 112A is BA, and a vertical distance between the top edge 113A and a lower end of the first guiding part G1A is CA. Similar to the dimensional relationships for A, B and C of FIG. 4, a relationship of AA, BA and CA in FIG. 6A can be:

AA<BA, 0.5≤AA<100 mm,

3≤BA≤100 mm, and

1≤CA≤600 mm.

In one embodiment, CA can be ranged by 1≤CA≤250 mm. In one embodiment, a relationship of AA, BA and CA can be:

AA<BA, 0.5≤AA<50 mm,

3≤BA≤50 mm, and

1≤CA≤125 mm.

Empirically, the guide function of the first guiding part G1A of FIG. 6A is better than that of the first guiding part G1 of FIG. 4. Namely, as the distance CA between the top edge 113A and the lower end of the first guiding part G1A becomes longer, the associated self alignment would be better.

Figure 6B:
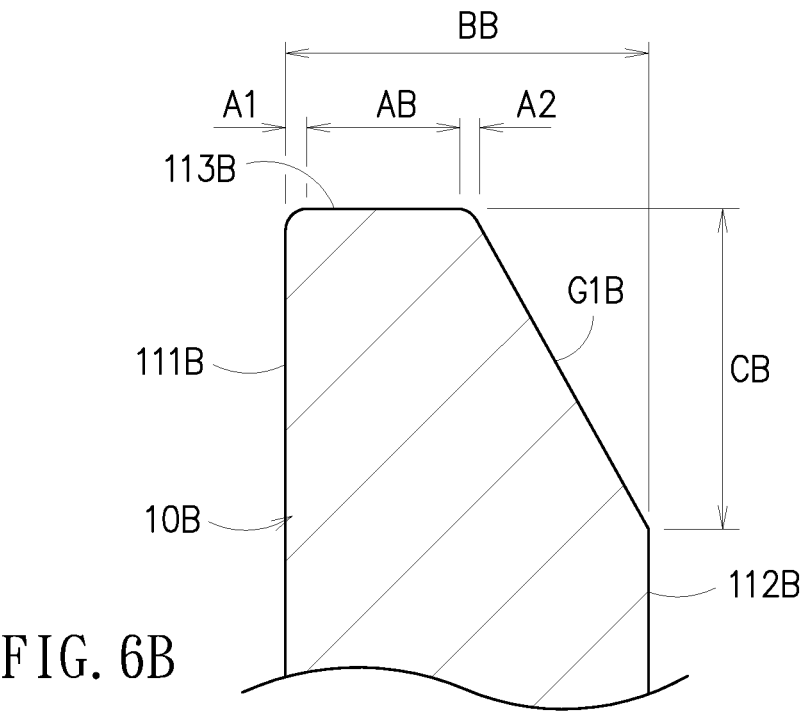

Referring to FIG. 6B, a cross-sectional view of the top portion of the crucible 10B is schematically shown. The first guiding part G1B of FIG. 6B is modified from the first guiding part G1A of FIG. 6A. In comparison to the first guiding part G1A of FIG. 6A, a connection of the top edge 113B of FIG. 6B and the main outer wall 111B and that of the top edge 113B and the first guiding part G1B are both modified to be round corners. Similarly, a connection of the first guiding part G1B and the main inner wall 112B can be also shaped to be another round corner. In addition, each of the foregoing round corners can be replaced by a chamfer.

A width of the top edge 113B is AB, a distance between the main outer wall 111B and the main inner wall 112B is BB, a vertical distance between the top edge 113B and a lower end of the first guiding part G1B is CB; a connection of the top edge 113B and the main outer wall 111B has a width of round corner (for example, a radius) of A1; and, a conduction of the top edge 113B and the first guiding part G1B has a width of round corner (for example, a radius) of A2.

Similar to the dimensional relationships for A, B and C of FIG. 4, a relationship of AB, BB and CB in FIG. 6B can be:

AB<BB, 0.5≤AB<100 mm,

3≤BB≤100 mm, and

1≤CB≤600 mm.

In one embodiment, CB can be ranged by 1≤CB≤250 mm. In one embodiment, a relationship of AB, BB and CB can be:

AB<BB, 0.5≤AB<50 mm,

3≤BB≤50 mm, and

1≤CB≤125 mm.

In particular, the dimensions of A1 and A2 are mainly determined according to practical requirements; for example, A1+A2≤AB.

Figure 6C:
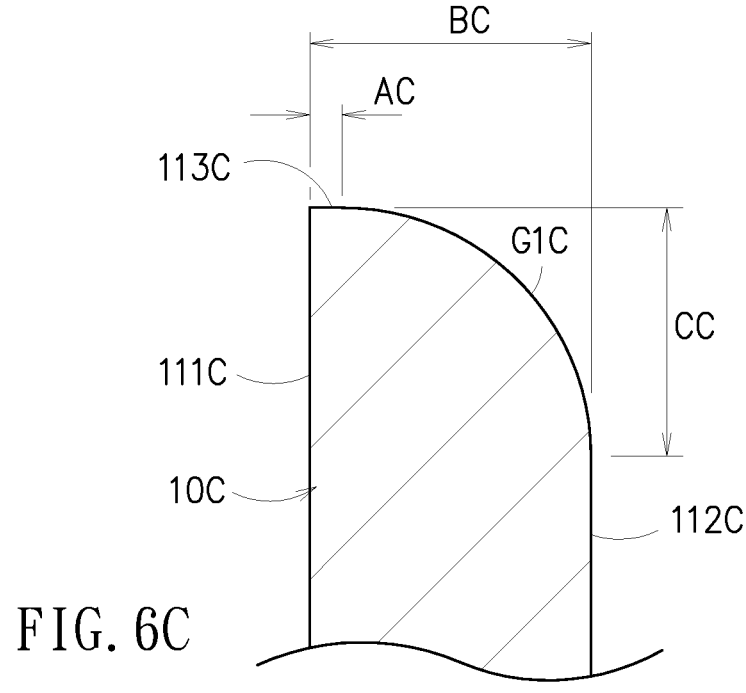

Referring to FIG. 6C, a cross-sectional view of the top portion of the crucible 10C is schematically shown. The first guiding part G1C is a convex arc. A width of the top edge 113C is AC, a distance between the main outer wall 111C and the main inner wall 112C is BC, and a vertical distance between the top edge 113C and a lower end of the first guiding part G1C is CC. Similar to the dimensional relationships for A, B and C of FIG. 4, a relationship of AC, BC and CC in FIG. 6C can be:

AC<BC, 0.5≤AC<100 mm,

3≤BC≤100 mm, and

1≤CC≤600 mm.

In one embodiment, CC can be ranged by 1≤CC≤250 mm. In one embodiment, a relationship of AC, BC and CC can be:

AC<BC, 0.5≤AC<50 mm,

3≤BC≤50 mm, and

1≤CC≤125 mm.

Figure 6D:
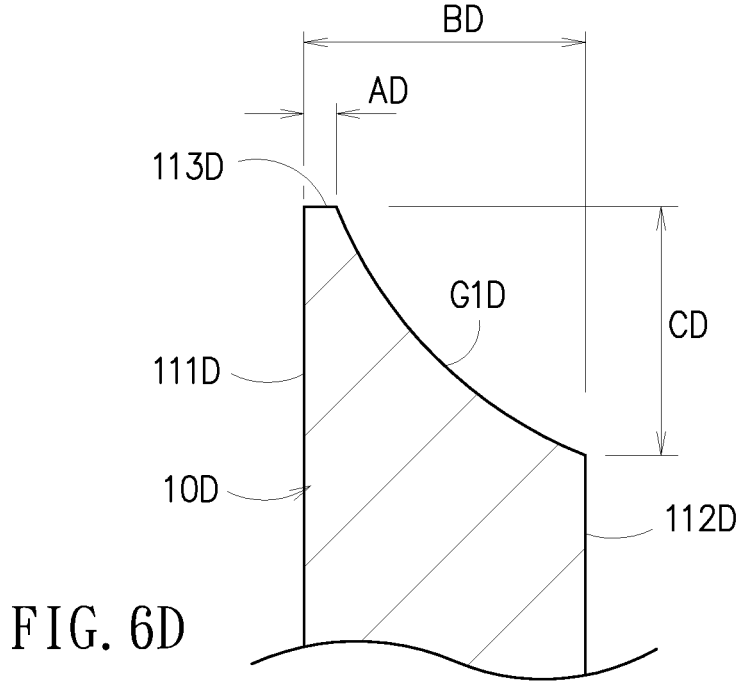

Referring to FIG. 6D, a cross-sectional view of the top portion of the crucible 10D is schematically shown. The first guiding part G1D is a concave arc. A width of the top edge 113D is AD, a distance between the main outer wall 111D and the main inner wall 112D is BD, and a vertical distance between the top edge 113D and a lower end of the first guiding part G1D is CD. Similar to the dimensional relationships for A, B and C of FIG. 4, a relationship of AD, BD and CD in FIG. 6D can be:

AD<BD, 0.5≤AD<100 mm,

3≤BD≤100 mm, and

1≤CD≤600 mm.

In one embodiment, CD can be ranged by 1≤CD≤250 mm.

In one embodiment, a relationship of AD, BD and CD can be:

AD<BD, 0.5≤AD<50 mm, $3 \leq BD \leq 50$ mm, and $1 \leq CD \leq 125$ mm.

In this disclosure, each of different aspects of the first guiding part G1A, G1B, G1C, G1D shown in FIG. 6A to FIG. 6D, respectively, can be adopted to the second guiding part G2 of the lid of FIG. 1.

Figure 7A:
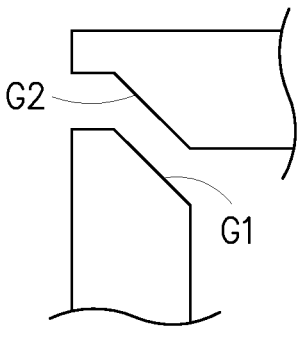
FIG. 7A to FIG. 7C show schematically different pairs of the lid and the crucible in accordance with this disclosure.
Figure 7B:
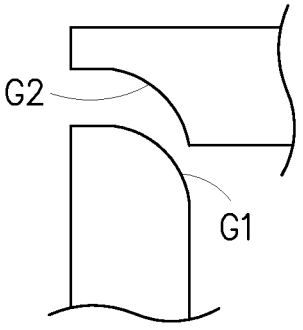
Figure 7C:
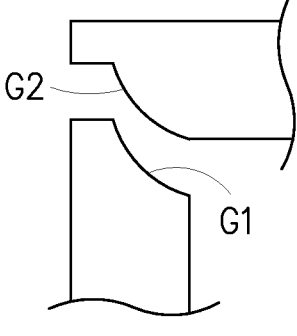

Referring to FIG. 7A to FIG. 7C, the first guiding part G1 and the second guiding part G2 of FIG. 7A are both chamfers, the first guiding part G1 of FIG. 7B is a convex arc while the second guiding part G2 thereof is a concave, and the first guiding part G1 of FIG. 7C is a concave arc while the second guiding part G2 thereof is a convex arc.

In this disclosure, the aspects of the first guiding part G1 and the second guiding part G2 are interchangeable. Empirically, all the aforesaid non-right angle first guiding parts and second guiding parts can provide well guide to the lid.

Figure 8:
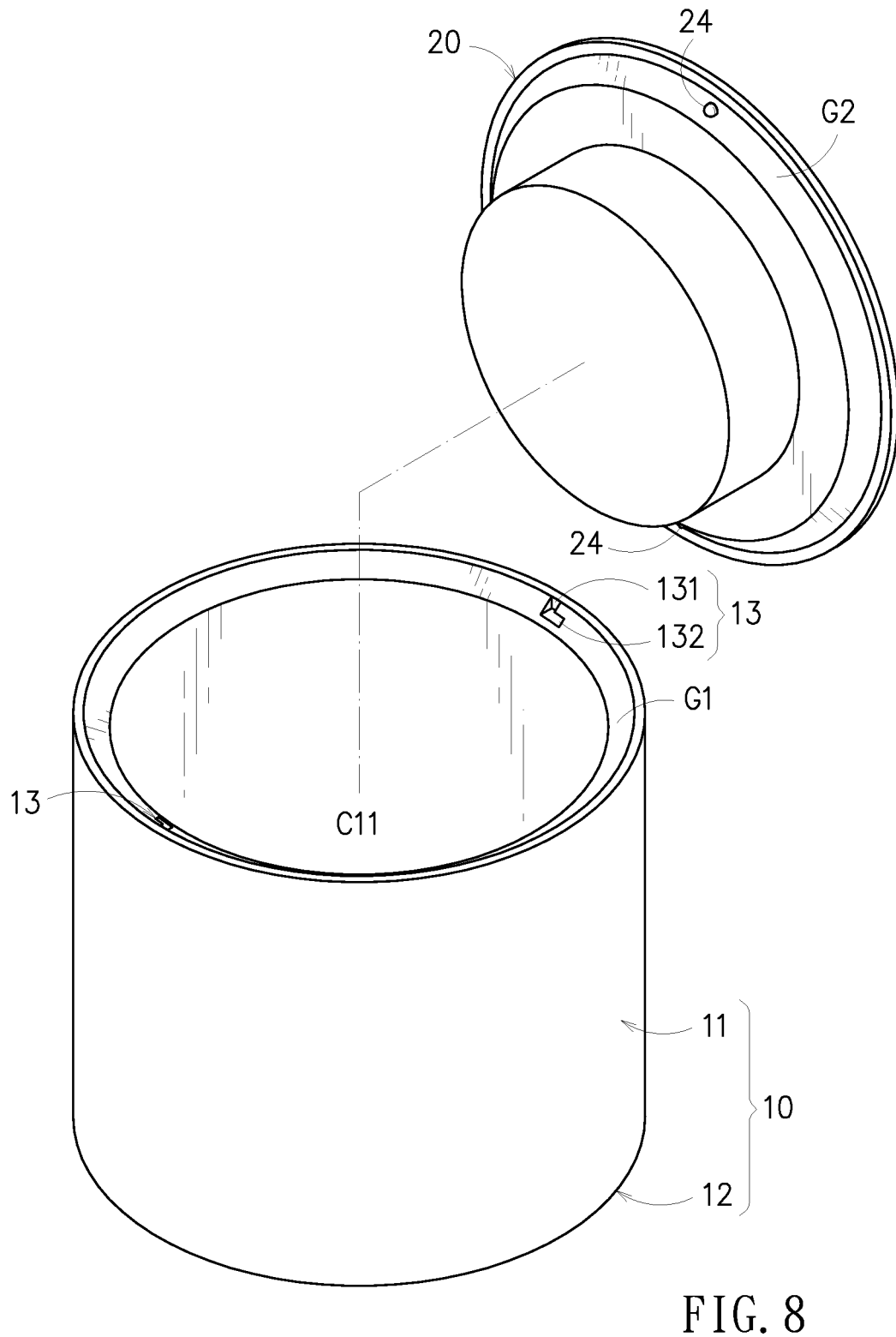
FIG. 8 is a schematic view of an improvement of FIG. 1 having positioning nodes at the lid to pair positioning notches at the crucible.

Referring to FIG. 8, a major difference between this embodiment herein and that of FIG. 1 is that, in the embodiment of FIG. 8, a pair of positioning notches 13 are individually and symmetrically provided to opposite sides of the first guiding part G1 of the crucible 10, and a pair of positioning nodes 24 corresponding to the positioning notches 13 are individually and symmetrically provided to opposite sides of the second guiding part G2 of the lid 20.

Each of the positioning notches 13 is consisted of a leading section 131 and an engaging section 132. The leading section 131 is parallel to an axial direction C11 of the body 11, and extends by a length. The engaging section 132 is perpendicular to the leading section 131, and extends by another length. Thereupon, the positioning notch 13 is shaped as an "L".

When the lid 10 covers the top of the crucible 20 by having the first guiding part G1 to contact the second guiding part G2, the positioning node 24 can enter the corresponding positioning notch 13 via the leading section 131, and then the lid 10 is rotated to send the positioning node 24 into the engaging section 132, such that the lid 10 can be detachably engaged to the top of the crucible 20.

In the embodiment of FIG. 8, each of the positioning nodes 24 is protruded by being parallel to a bottom of the corresponding engaging section 132, but not limited thereto.

In the embodiment of FIG. 8, it is obvious that the lid and the crucible of this disclosure are furnished with the first guiding part and the second guiding part to match each other, and further can be provided with auxiliary engagement parts for ensuring the engagement of the lid and the crucible. These auxiliary engagement parts can include the aforesaid pair of the positioning node and the positioning notch buckling to each other, or any other auxiliary engagement structures for helping engaging between the lid and the crucible.

Figure 9:
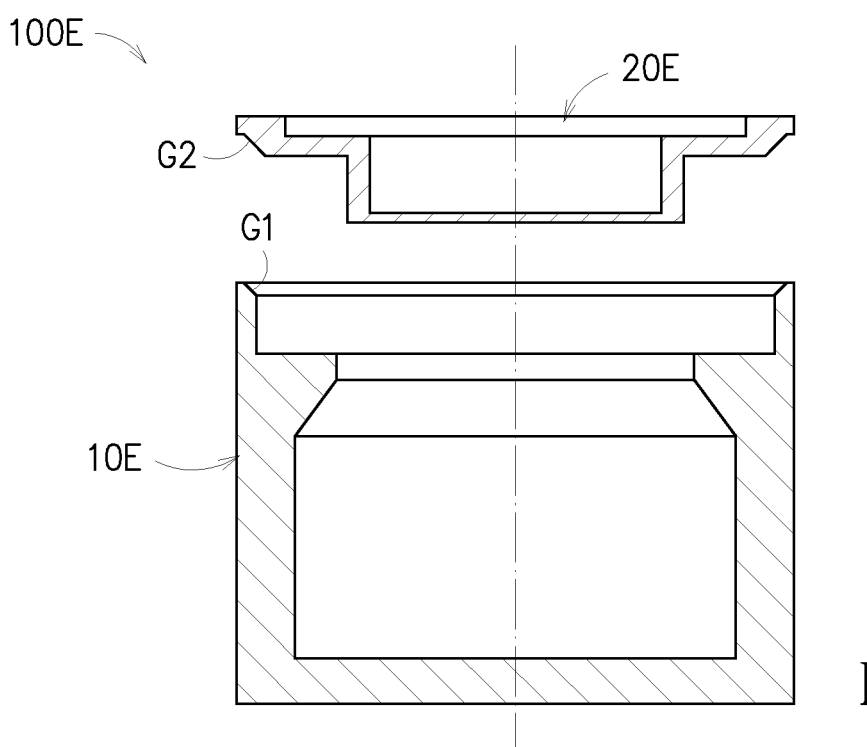
FIG. 9 and FIG. 10 show schematically further embodiments of the apparatus for producing an ingot in accordance with this disclosure.
Figure 10:
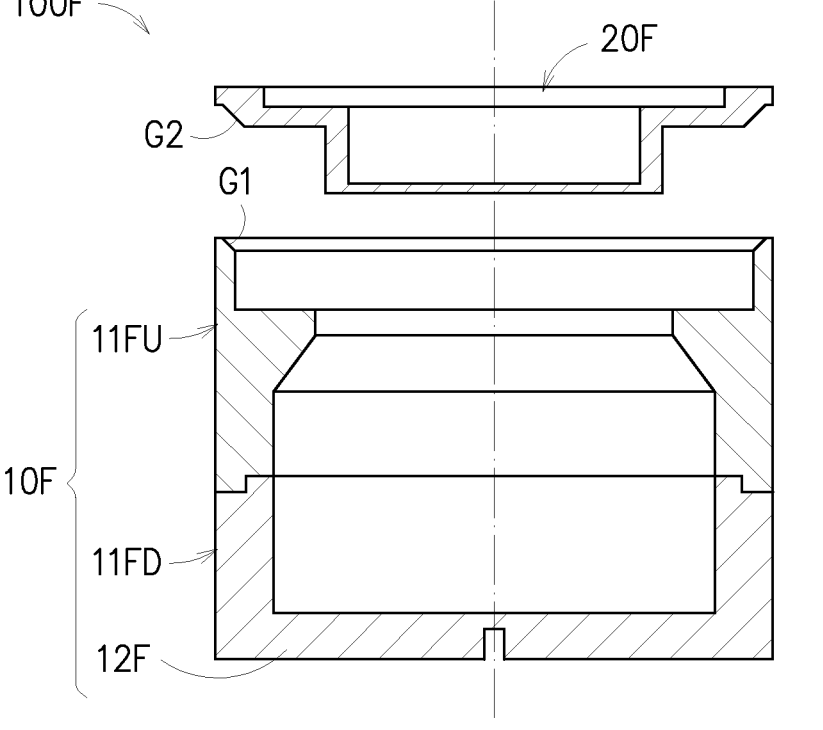

Referring to FIG. 9 and FIG. 10, this disclosure can be applied to versatile lids and crucibles. As shown in FIG. 9, an apparatus 100E for producing an ingot E has a crucible 10E and a lid 20E. As shown in FIG. 10, an apparatus 100F for producing an ingot has a crucible 10F and a lid 20F. The crucible 10F is consisted of an upper body 11FU, a lower body 11FD and an end bottom 12F, in which the upper body 11FU is detachably disposed on top of the lower body 11FD.

Nevertheless, no matter what type of the crucible or the lid is, the first guiding part G1 and the second guiding part G2 can be provided to the crucible and the lid, respectively. In addition, the crucible and the lid shown in FIG. 1 to FIG. 9 can be replaced individually.

To sum up, the apparatus for producing an ingot provided in this disclosure is suitable for the process for growing the semiconductor ingots. In this disclosure, the first guiding part and the second guiding part corresponding to the lid and the crucible, respectively, are not right-angle structures. With the first guiding part and the second guiding part to provide the self-guiding function, when the lid floats and then falls during the vacuuming process, the lid can be tightly engaged with the crucible. Thereupon, the quality and yield of the ingot growth can be substantially enhanced.

Empirically, while the apparatus for producing an ingot provided in this disclosure is applied to the ingot growth process, the single crystal form can be increased from 50%-60% to 90%-100%, or even 95%-100%, and the defects of the ingots can be significantly reduced. Thereupon, the yield and quality of the ingot growth can be both improved, and thus the cost for growing the ingots can be substantially reduced.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An apparatus for producing an ingot, applied to an ingot-growing process, comprising:

a crucible, having a hollow cylindrical body with an end bottom to provide thereinside an internal space for accommodating a raw crystal-growing material, a top of the body having oppositely an annular main outer wall and an annular main inner wall, an outer diameter of the annular main outer wall being greater than an inner diameter of the annular main inner wall, an annular top edge being formed to connect the annular main outer wall and the annular main inner wall, a connection portion of the annular main inner wall and the annular top edge being defined as an annular first guiding part, the annular first guiding part being a non-right angle structure; and a lid, having a bottom for disposing a seed, the bottom having a bottom protrusion, a maximum outer diameter of the bottom protrusion being less than a maximum outer diameter of the lid, an outer wall of the bottom protrusion having an annular second guiding part corresponding to the annular first guiding part, the annular second guiding part being a non-right angle structure, the lid being detachable and covering the top of the crucible when the bottom protrusion is inserted into the annular the main inner wall, and the annular first guiding part contacts the annular second guiding part;

wherein a portion of the bottom of the lid surrounding the bottom protrusion is flush against the annular top edge of the crucible when the annular first guiding part is in contact with the annular second guiding part;

wherein a positioning notch having a leading section and an engaging section is disposed within the annular first guiding part, and a positioning node is disposed upon the annular second guiding part, such that the lid is configured to cover the top of the crucible with the annular first guiding part conformably mating with the annular second guiding part when the positioning node is inserted into the leading section of the positioning notch, and the lid is detachable from the crucible when the positioning node and the annular first guiding part separate from the annular second guiding part and the leading section of the positioning notch;

wherein the leading section is parallel to an axial direction of the body and the engaging section is perpendicular to the leading section;

wherein when the annular first guiding part is conformably mated with the annular second guiding part, the lid is configured to allow the lid to float, separate from the crucible, fall back to tightly engage with the crucible, and rotate to displace the positioning node into the engaging section of the positioning notch to secure the lid to the crucible.

2. The apparatus for producing an ingot of claim 1, wherein the annular first guiding part is a chamfer structure, and the annular second guiding part is another chamfer structure.

3. The apparatus for producing an ingot of claim 1, wherein a width of top edge is A, a distance between the annular main outer wall and the annular main inner wall is B, and a vertical distance between the annular top edge and a lower edge of the annular first guiding part is C; wherein a relationship of the A, the B and the C is:

$A<B$, $0.5 \leq A < 100$ mm, $3 \leq B \leq 100$ mm, and $1 \leq C \leq 600$ mm.

4. The apparatus for producing an ingot of claim 3, wherein the C is ranged by $1 \leq C \leq 250$ mm.

5. The apparatus for producing an ingot of claim 3, wherein the relationship of the A, the B and the C is:

$A<B$, $0.5 \leq A < 50$ mm, $3 \leq B \leq 50$ mm, and $1 \leq C \leq 125$ mm.

6. The apparatus for producing an ingot of claim 1, wherein the annular first guiding part is a convex arc, a concave arc or any non-right angle geometric shape, and the annular second guiding part is a convex arc, a concave arc or any non-right angle geometric shape.

7. The apparatus for producing an ingot of claim 1, wherein at least one of a connection portion of the annular top edge and the annular main outer wall, a connection portion of the annular top edge and the annular first guiding part, and a connection portion of the annular first guiding part and the annular main inner wall is an arc structure or a chamfer structure.

8. The apparatus for producing an ingot of claim 1, wherein a second positioning notch having a second leading section and a second engaging section is disposed opposite the positioning notch within the annular first guiding part, and a second positioning node is disposed opposite the positioning node upon the annular second guiding part, such that the lid is configured to cover the top of the crucible with the annular first guiding part conformably mating with the annular second guiding part when the positioning node and the second positioning node are simultaneously inserted into the positioning notch and second positioning notch, respectively, and the lid is detachable from the crucible when the positioning node, the second positioning node, and the annular first guiding part separate from the respective leading section of the positioning notch, the leading section of the second positioning notch, and the annular second guiding part.

9. The apparatus for producing an ingot of claim 1, wherein the leading section extends by a length, and the engaging section extends by another length to form an L-shaped positioning notch.

10. The apparatus for producing an ingot of claim 1, wherein the lid further comprises a protrusive platform disposing the seed, and another portion of the bottom of the lid;

wherein the protrusive platform is positioned in a central portion and extending from the bottom protrusion, the diameter of the protrusive platform being smaller than the maximum outer diameter of the bottom protrusion;

wherein the another portion of the bottom of the lid surrounds the protrusive platform.

11. The apparatus for producing an ingot of claim 10, wherein the another portion of the bottom of the lid has a flat surface positioned between the protrusive platform and the annular second guiding part.

12. The apparatus for producing an ingot of claim 11, wherein the protrusive platform further comprises a flat surface parallel to the flat surface of the another portion and an exterior surface of the lid facing away from the crucible.

* * * * *